US012603477B2

(12) United States Patent
Wu et al.

(10) Patent No.: US 12,603,477 B2
(45) Date of Patent: Apr. 14, 2026

(54) RIDGE-SHAPED LASER STRUCTURE AND SURFACE ETCHED GRATING SEMICONDUCTOR LASER WITH PERIODIC PUMPING

(71) Applicant: Shenzhen Banyan Photonics Technologies Co., Ltd., Shenzhen (CN)

(72) Inventors: Fang Wu, Shenzhen (CN); Yongbo Tang, Shenzhen (CN); Christopher D. Watson, Shenzhen (CN); Kirill Y. Pimenov, Shenzhen (CN); Yury Logvin, Shenzhen (CN)

(73) Assignee: Shenzhen Banyan Photonics Technologies Co., Ltd., Shenzhen (CN)

( * ) Notice: Subject to any disclaimer, the term of this patent is extended or adjusted under 35 U.S.C. 154(b) by 634 days.

(21) Appl. No.: 18/091,664

(22) Filed: Dec. 30, 2022

(65) Prior Publication Data

US 2023/0216274 A1 Jul. 6, 2023

(30) Foreign Application Priority Data

Dec. 31, 2021 (CN) .......................... 202111671737.2

(51) Int. Cl.
*H01S 5/12* (2021.01)
*H01S 5/22* (2006.01)

(52) U.S. Cl.
CPC .............. *H01S 5/12* (2013.01); *H01S 5/1228* (2013.01); *H01S 5/22* (2013.01)

(58) Field of Classification Search
CPC .............. H01S 5/12; H01S 5/22; H01S 5/1228
See application file for complete search history.

(56) References Cited

U.S. PATENT DOCUMENTS 4,722,092 A * 1/1988 Liau ........................ H01S 5/187
372/50.11
5,727,013 A 3/1998 Botez et al.
(Continued)

FOREIGN PATENT DOCUMENTS

CN 18234856 A 8/2006
CN 105576502 A 5/2016
(Continued)

OTHER PUBLICATIONS

Belt et al., Erbium-doped waveguide DBR and DFB laser arrays integrated within an ultra-low-loss Si3N4 platform, Optics Express, vol. 22 No. 9 (2014).*
(Continued)

*Primary Examiner* — James A Menefee
(74) *Attorney, Agent, or Firm* — Taft, Stettinius & Hollister LLP

(57) ABSTRACT

Disclosed is a surface etched grating semiconductor laser with periodic pumping structure. The structure includes a lower doped dielectric layer, a multiple quantum well active layer, a ridge-shaped doped dielectric layer, periodic grating grooves formed on the ridge-shaped doped dielectric layer and a top electrical contact layer forming ohmic electrical contact with electrical contact regions between the grating grooves. Carriers are injected through the periodic electrical contact layer, flow through the electrical contact regions, spread laterally when reaching the bottom of the grating grooves, and then continue to spread to the multiple quantum well active layer. In a case of uniform distribution, a laser based on refractive index modulation is realized. In a case of non-uniform distribution, a laser with mixed modulation is realized by introducing additional gain modulation.

16 Claims, 5 Drawing Sheets

A-A'

(56) References Cited

U.S. PATENT DOCUMENTS

| | | | |
|---|---|---|---|
| 6,026,110 A | 2/2000 | Makino | |
| 2001/0046246 A1 | 11/2001 | Watanabe et al. | |
| 2005/0123018 A1 | 6/2005 | Takagi et al. | |
| 2008/0303046 A1 | 12/2008 | Furuyama | |
| 2009/0268771 A1 | 10/2009 | Patchell et al. | |
| 2012/0106583 A1 | 5/2012 | Watson et al. | |
| 2020/0335940 A1* | 10/2020 | Huang | H01S 5/0202 |
| 2020/0403375 A1 | 12/2020 | Wunderer | |

FOREIGN PATENT DOCUMENTS

| | | | | | |
|---|---|---|---|---|---|
| CN | 105811242 A | * | 7/2016 | | H01S 5/22 |
| CN | 107611776 A | | 1/2018 | | |
| CN | 111755946 A | * | 10/2020 | | H01S 5/22 |
| CN | 113422295 A | | 9/2021 | | |
| CN | 114465090 A | | 5/2022 | | |
| CN | 114498295 A | | 5/2022 | | |
| CN | 116780334 A | | 9/2023 | | |
| JP | 2009117551 A | | 5/2009 | | |

OTHER PUBLICATIONS

Chinese Patent Office, First Office Action issued in corresponding Application No. 202111671737.2, dated Oct. 17, 2024, 7 pp.

Chinese Patent Office, Second Office Action issued in corresponding Application No. 202111671737.2, dated Dec. 15, 2024, 6 pp.

Feng, G., "Study of gain-coupled distributed feedback semiconductor lasers based on periodic injection current," Dissertation, Changchun Institute of Optics, Fine Mechanics and Physics, Chinese Academy of Sciences, Jun. 2018, pp. 69-77.

Chinese Patent Office, Notice of Allowance issued in corresponding Application No. 202111671737.2, dated Jul. 25, 2025, 5 pp.

Kneubuhl et al., "Advanced Coupled-Wave Theory on Distributed-Feedback and Helical-Feedback Lasers," Chinese Journal of Infrared Research, Dec. 31, 1988, pp. 241-250.

Sadeghi et al., "Purely loss-coupled distributed feedback lasers based on electromagnetically induced absorption in active photonic band gaps," Physical Review A, 2007, vol. 75, 5 pp.

* cited by examiner

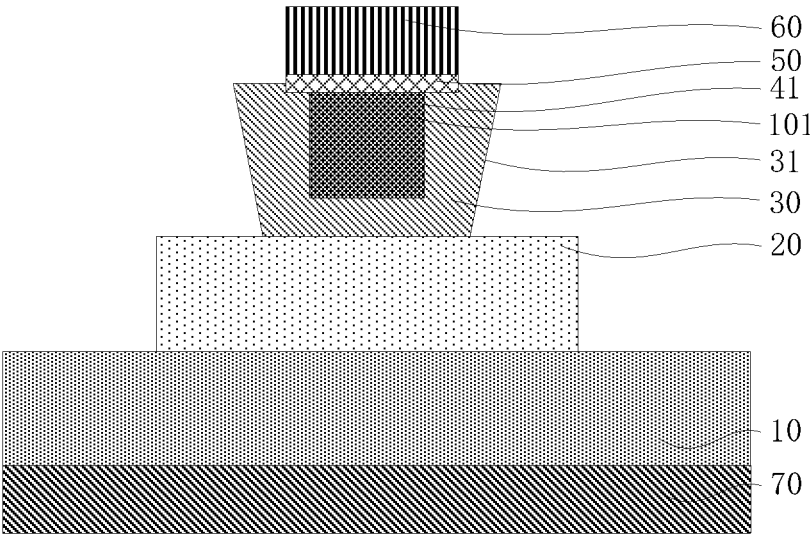

| Providing a substrate and a component epitaxial structure, and the component epitaxial structure includes an optional functional dielectric layer, a lower doped dielectric layer, a multiple quantum well active layer and a ridge-shaped doped dielectric layer stacked in sequence | S110 |

↓

| Forming a grating structure on the ridge-shaped doped dielectric layer, the grating structure includes a plurality of grating grooves periodically spaced along the waveguide direction of the laser, and electrical contact regions defined by the grating grooves, an insulating layer covering at least the sidewalls of the grating grooves is formed in the grating grooves | S120 |

↓

| Forming a top electrode layer, and the top electrode layer forms an ohmic electrical contact region at least with the top surface of the electrical contact regions, so that the carriers injected through the top electrode layer flow through the periodic electrical contact regions and the bottom of the grating grooves in turn, and diffuse laterally to the multiple quantum well active layer to form a carrier distribution region for providing pumping | S130 |

FIG. 7

RIDGE-SHAPED LASER STRUCTURE AND SURFACE ETCHED GRATING SEMICONDUCTOR LASER WITH PERIODIC PUMPING

CROSS-REFERENCE TO RELATED DISCLOSURES

This application claims priority to Chinese patent application No. 202111671737.2 filed with the Chinese Patent Office on Dec. 31, 2021, entitled "SURFACE ETCHED GRATING SEMICONDUCTOR LASER WITH PERIODIC PUMPING", the entire contents of which are incorporated by reference.

TECHNICAL FIELD

The application relates to the semiconductor laser and photonic integration technologies, in particular to a ridge-shaped laser structure and a surface etched grating semiconductor laser with periodic pumping.

BACKGROUND

Distributed feedback (DFB) semiconductor lasers are widely deployed in optical communication systems due to their dynamic single mode, compact size, integration capability and reliable light sources. Basic elements of a laser include three parts: a gain medium, a cavity with a feedback mechanism, and an energy input. A distributed feedback laser has two mechanisms to achieve feedback, which are periodic refractive index modulation and periodic gain (loss) modulation.

Traditional distributed feedback semiconductor lasers have a high manufacturing cost, a low yield and a poor reliability.

SUMMARY

In response to the above-mentioned problems in the background technology, the present application provides a ridge-shaped laser with periodic pumping based on a surface etched grating, which effectively improves the performance of semiconductor lasers, lowers the manufacturing cost, increases the yield, and improves reliability.

In order to achieve the above purpose and other related purposes, the present application provides a ridge-shaped laser structure. The ridge-shaped laser structure includes a lower doped dielectric layer, a multiple quantum well active layer, a ridge-shaped doped dielectric layer, and a grating structure formed on the ridge-shaped doped dielectric layer and a top electrode layer formed on a top surface of the grating structure, stacked in sequence. The grating structure includes a plurality of grating grooves periodically spaced along a waveguide direction of the laser and periodically spaced electrical contact regions between the grating grooves. An insulating layer at least covering sidewalls of each grating grooves is formed in each of the grating grooves. Ohmic electrical contact is formed between the top electrode layer and a top surface of each of the electrical contact regions, such that carriers injected through the top electrode layer flow downward through the electrical contact regions and the ridge-shaped doped dielectric layer in turn, and then enter the multiple quantum well active layer, the injected carriers in the multiple quantum well active layer exhibit a certain carrier density distribution region due to the existence of the insulated grating grooves.

In one of the embodiments, a maximum width of an orthographic projection of a bottom surface of each of the grating grooves on an upper surface of the multiple quantum well active layer is less than or equal to a minimum distance between the bottom surface of the grating grooves and the upper surface of the multiple quantum well active layer, such that the carriers in the certain carrier density distribution region are uniformly distributed under different values of injection current.

In one of the embodiments, a maximum distance between a bottom surface of the grating grooves and an upper surface of the multiple quantum well active layer is less than or equal to two times of a minimum length of an orthographic projection of the bottom surface of the grating grooves on the upper surface of the multiple quantum well active layer, such that a periodical and non-uniform distribution of carriers in the certain carrier density distribution region in the waveguide direction to form a gain modulation. A modulation period of the gain modulation is consistent with a grating period.

In one of the embodiments, a refractive index modulation resulted from the grating structure and the gain modulation resulted from the top electrode layer have a preset phase relationship. An intensity of the gain modulation or an intensity of the refractive index modulation are associated with a grating duty cycle, and a grating order of the grating structure. The grating duty cycle is defined as a ratio of a width of unetched material between the bottom surface of adjacent grating grooves to the grating period, and the grating period is an average spacing between adjacent grating grooves.

In one of the embodiments, the grating grooves are formed in the ridge-shaped doped dielectric layer, and a depth of the grating grooves is ranged from 0.1h to h; wherein h is a thickness of the ridge-shaped doped dielectric layer. By setting the shape, size and depth of the grating grooves, the carriers injected through the top electrode layer flow through the electrical contact regions and the bottom of the grating grooves in turn, and then spread laterally to the multiple quantum well active layer, forming a carrier distribution region with uniform carrier distribution, providing uniformly pumped carriers for the laser and effectively improving the performance and stability of the laser operation.

In one of the embodiments, the top electrode layer partially or completely covers the grating structure.

In one of the embodiments, the insulating layer includes dielectric materials and/or polymer materials.

In one of the embodiments, the lower doped dielectric layer and the ridge-shaped doped dielectric layer have different doping types.

In one of the embodiments, the ridge-shaped laser structure further includes at least one functional dielectric layer, the at least one functional dielectric layer is formed on a side of the lower doped dielectric layer away from the multiple quantum well active layer. The functional dielectric layer is integrated with functional components integrates functional components, the functional components include at least one of passive components, active components, control components, and mode conversion components.

The present invention further provides a surface etched grating semiconductor laser with a periodic pumping structure, including any of the ridge-shaped laser structures described in the embodiments of the present application.

BRIEF DESCRIPTION OF THE DRAWINGS

In order to better describe and illustrate the embodiments and/or examples of the present application, the drawings may be referenced. The additional details or examples used to describe the drawings should not be considered to limit the scope of any of the present application, the embodiments and/or examples as presently understood and the best mode of the application as presently understood.

FIG. 6 is a schematic cross-sectional structure diagram of a ridge-shaped laser structure along a direction perpendicular to the waveguide of the laser according to another embodiment of the present disclosure.

FIG. 7 is a schematic flowchart of a method for fabricating a ridge-shaped laser structure according to an embodiment of the present application.

DETAILED DESCRIPTION OF THE EMBODIMENTS

Figure 1:
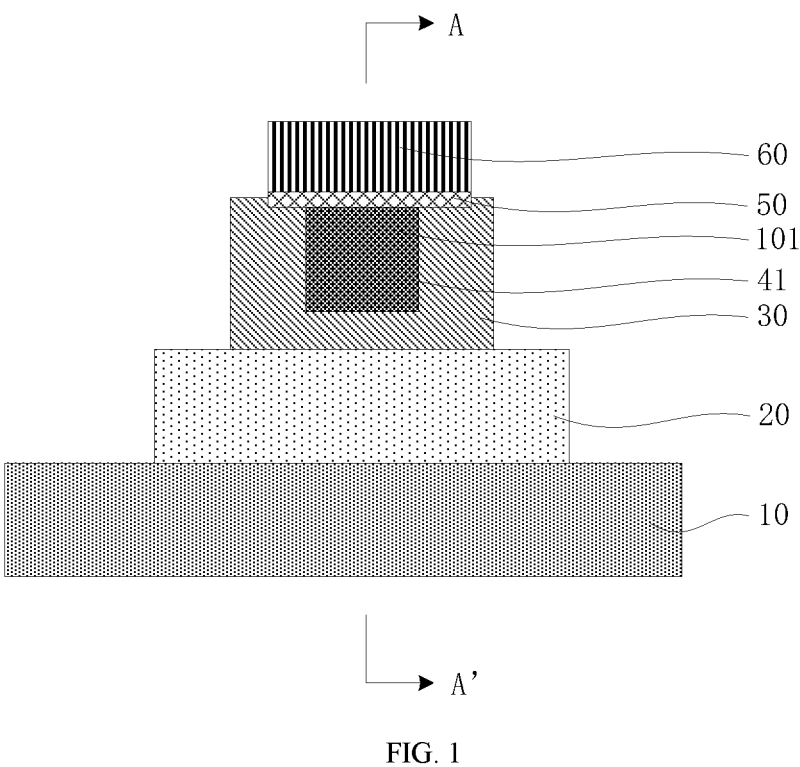
FIG. 1 is a schematic cross-sectional structure diagram of a ridge-shaped laser structure along a direction perpendicular to the waveguide of the laser according to an embodiment of the present application.

To better understand the application, the application will be described comprehensively with drawings. The drawings show the preferred embodiments of the present application. However, the application may be implemented in many different forms and is not limited to the embodiments described herein. Rather, these embodiments are provided so that this application will be thorough and complete.

Unless otherwise defined, all technical and scientific terms used herein have the same meaning as commonly understood by one of ordinary skill in the technical field to which the present application belongs. The terms used herein are for the purpose of describing specific embodiments only and are not intended to limit the application. As used herein, the term "and/or" includes all combinations of one or more of the listed items.

It should be understood that when an element or layer is referred to as being "on," "adjacent to," "connected to," or "coupled to" other elements or layers, it may be directly on, adjacent, connected or coupled to other elements or layers, or be present intermediately in elements or layers. In contrast, when an element is referred to as being "directly on," "directly adjacent to," "directly connected to," or "directly coupled to" other elements or layers, there are no intermediary elements or layers present. Although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the guidelines of the application.

Spatial relational terms such as "under", "below", "beneath", "underneath", "above", "on top of", etc., may be used herein for convenience of describing the relationship of one element or feature to other elements or features shown in the drawings. In addition to the orientation shown in the drawings, the spatial relation terms are harmonized with different orientations of the device in use. For example, if the device in the drawings is turned over, then elements or features described as "below" or "beneath" or "underneath" other elements or features would then be oriented "above" the other elements or features. Thus, the exemplary terms "below" and "under" may encompass both an orientation of above and below. The device may be oriented in other way (rotated 90 degrees or at other orientations) and the spatial description used herein should be interpreted accordingly.

The terminology used herein is for the purpose of describing particular embodiments only and is not intended to limit the application. As used herein, the singular forms "a," "an," and "the/this" are intended to include the plural forms as well, unless the context clearly dictates otherwise. It is also to be understood that the terms "compose" and/or "include", used in this description, identify the presence of stated features, integers, steps, operations, elements and/or components, but do not exclude the presence or addition of one or more other of features, integers, steps, operations, elements, parts and/or groups. As used herein, the term "and/or" includes all combinations of the listed items.

Embodiments (and intermediate structures) of the application are described herein with schematic and cross-section illustration references. As such, variations of the shapes shown due to for example, manufacturing techniques and/or tolerances, may be expected. Thus, embodiments of the application should not be limited to the particular shapes of the regions shown herein, but include shape deviations due to, for example, manufacturing. The regions shown in the drawings are illustrative, they are not intended to show the actual shapes of the regions of the device and are not intended to limit the scope of this application.

Referring to FIGS. 1-7, it should be noted that the drawings provided in the disclosed embodiments are only to illustrate the basic concepts of the application in a schematic way. Although the drawings only show the components related to the application rather than the number, shape, and size of the components of actual dimension drawing, the type, quantity and proportion of each component may be arbitrarily changed in actual implementation, and the component layout may also be more complicated.

Figure 2:
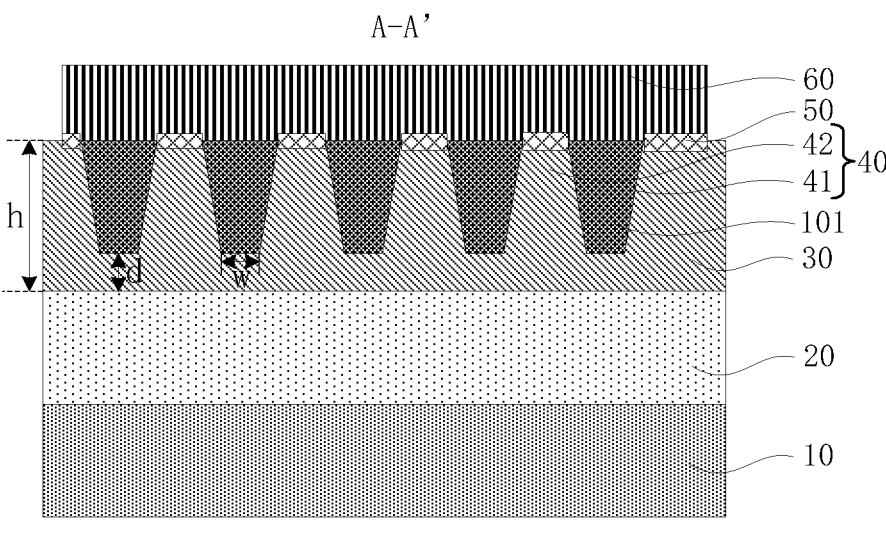
FIG. 2 shows a schematic diagram of a cross-sectional structure along the AA' direction in FIG. 1.

Referring to FIG. 1 and FIG. 2, in an embodiment of the present application, a ridge-shaped laser structure is provided. The ridge-shaped laser structure includes a lower doped dielectric layer 10, a multiple quantum well active layer 20, a ridge-shaped doped dielectric layer 30, a grating structure 40 formed on the ridge-shaped doped dielectric layer 30, and a top electrode layer 60 formed on a top surface of the grating structure 40. The grating structure 40 includes a plurality of grating grooves 41 periodically spaced along the waveguide direction of the laser and electrical contact regions 42 defined by the grating grooves 41. The grating grooves 41 are etched on the top of the ridge-shaped doped dielectric layer 30 and distributed along the ridge. Each electrical contact region 42 is an unetched semiconductor area between adjacent grating grooves. An insulating layer 101 is formed in each of the grating grooves 41 and at least covers sidewalls of each of the grating grooves 41. In other words, the semiconductor material inside the grating grooves 41 are protected with nonconductive materials (insulating layer 41). The nonconductive materials include, but not limited to, dielectric or polymer-based materials. An ohmic electrical contact layer 50 is formed between the top electrode layer 60 and a top surface of each of the electrical contact regions 42. The ohmic electrical contact layer 50 at least contacts with the top surface of each of the electrical contact regions 42. The carriers injected through the top electrode layer 60 and the periodic ohmic electrical contact layer 50 flow through the electrical contact regions 42 and the bottom of the grating grooves 41 in turn, and then diffuse laterally to the multiple quantum well active layer 20. Due to the existence of the insulated grating grooves 41, the injected carriers in the multiple quantum well active layer 20 exhibit a certain carrier density distribution region for providing electric pumping. It should be note that periods of the periodically spaced grating grooves 41 and the ohmic electrical contact layer 50 proposed in this embodiment are not specifically limited, and the both may be or may not be of equal periods.

In an embodiment, with continuous reference to FIG. 1 and FIG. 2, the grating structure 40 that includes the plurality of grating grooves 41 periodically spaced along the waveguide direction of the laser and the electrical contact regions 42 defined by the grating grooves 41 are formed in the ridge-shaped doped dielectric layer 30. Since a distance between the bottom of the grating grooves 41 and the upper surface of the multiple quantum well active layer 20 is small relative to a maximum width of the orthogonal projection of the bottom of each of the grating grooves 41 on the multiple quantum well active layers 20, and the diffusion of the injected current has been restricted, the carrier density in the multiple quantum well active layer 20 fluctuates periodically with the grating grooves 41 in a direction of the laser cavity, resulting in a certain degree of gain modulation. The phase of the gain coupling coincides with the phase of the index coupling in the application, and the phase of the gain coupling and the phase of the index coupling will not cancel each other out, such that the gain modulation intensity and the refractive index modulation intensity can be tailored via the grating duty cycle, and the grating order of the grating grooves 41. Therefore, the laser stability and performance can be effectively improved, the yield can be increased, and the manufacture cost can be reduced. The grating duty cycle is defined as a ratio of the bottom width of the electrical contact region between adjacent grating grooves and a grating period, and the grating period is an average spacing between adjacent grating grooves.

In an embodiment, with continuous reference to FIG. 1 and FIG. 2, the distance d between the bottom of the grating grooves 41 and the upper surface of the multiple quantum well active layer 20 can be set, for example greater than or equal to a maximum width W of the orthogonal projection of the bottom of the grating grooves 41 on the multiple quantum well active layer 20, i.e. the ratio d/W is any value greater than one, so that under different values of injection current, the carries injected through the top electrode layer 60 and the periodic ohmic electrical contact layer 50 flow through the electrical contact regions 42 and the bottom of the grating grooves 41 in turn, and then diffuse laterally to the multiple quantum well active layer 20 to form a carrier distribution region with uniform carrier distribution to provide uniformly pumped carrier distribution for the laser.

In an embodiment, with continuous reference to FIG. 1 and FIG. 2, the grating structure 40 includes the plurality of grating grooves 41 periodically spaced along the waveguide direction of the laser and the electrical contact regions 42 defined by the grating groove 41, i.e., the distribution of the grating grooves 41 is periodic, so that the grating duty cycle of the grating structure 40 is associated with the gain modulation intensity of the ridge-shaped laser structure. A grating period is an average spacing between adjacent grating grooves, and the grating duty cycle is a ratio of the bottom width of the electrical contact regions 42 to the grating period. The grating order and the grating duty cycle of the grating structure 40 are associated with the refractive index modulation intensity of the ridge-shaped laser structure.

In an embodiment, with continuous reference to FIG. 1 and FIG. 2, the ohmic electrical contact layer 50 and the top electrode layer 60 may partially or completely cover the distributed grating structure 40.

In an embodiment, with continuous reference to FIG. 1 and FIG. 2, the grating grooves 41 are formed in the ridge-shaped doped dielectric layer 30. A maximum width W of the orthogonal projection of the bottom of the grating grooves 41 on the multiple quantum well active layer 20 is less than or equal to a minimum distance d between the bottom of the grating grooves 41 and the upper surface of the multiple quantum well active layer 20, so that the carriers in a certain carrier density distribution region are always uniformly distributed under different values of injection current. In this case, the carriers injected through the top electrode layer 60 flow through the electrical contact regions 42, and diffuse laterally when reaching the bottom of the grating grooves 41. Thus, a uniform carrier density distribution is formed in the multiple quantum well active layer 20, and the carrier density distribution is always uniform under different values of injection current, thus providing effective pumping for the laser.

In an embodiment, with continuous reference to FIG. 1-FIG. 2, the maximum width W of the orthogonal projection of the bottom of each of the grating grooves 41 on the multiple quantum well active layer 20 is less than or equal to the minimum distance d between the bottom of the grating grooves 41 and the upper surface of the multiple quantum well active layer 20, so that the carriers in the certain carrier density distribution region are periodically non-uniformly distributed in the waveguide direction, and a gain modulation is achieved. The modulation period of the gain modulation coincides with the grating period. In this case, the carriers injected through the periodic top electrode layer flow through the electrical contact regions, and the diffusion of the injected current at the bottom of the grating grooves is limited, which causes the carrier density to fluctuate periodically with the grating grooves in the direction of the laser cavity, resulting in a certain degree of gain modulation. The phase of the gain coupling generated by the gain modulation coincides with the phase of the refractive index coupling generated by the refractive index modulation in this application, and the phase of the gain coupling and the phase of the refractive index coupling will not cancel each other out to cause extra losses, thus effectively helping to suppress nonlinear effects merely caused by the spatial hole burning of the refractive index coupled laser cavity, and reduce the instability caused by external reflections. Therefore, the yield and the reliability are improved, and the manufacturing cost is reduced. In the embodiment, the laser has both the gain modulation and the refractive index modulation, and the ratio of the gain modulation to the refractive index modulation directly affects the mode stability of the laser. In the present application, the ratio of the gain modulation to the refractive index modulation may be adjusted by the grating order, the grating duty cycle, and the shape and the etching depth of each of the grating grooves. The grating duty cycle is the ratio of the electrical contact region (unetched portion) at the bottom of the grating grooves to the grating period, and the grating period is the average distance between adjacent grating grooves.

In an embodiment, with continuous reference to FIG. 1-FIG. 2, the grating grooves 41 are formed in the ridge-shaped doped dielectric layer 30. The depth of the grating grooves 41 may be ranged form 0.1h to h, and his the thickness of the ridge-shaped doped dielectric layer 30. The carriers in the carrier distribution region are always uniformly distributed under different values of injection current. By setting the shape, the size and the depth of the grating grooves, the carriers injected through the top electrode layer flow through the electrical contact regions and the bottom of the grating grooves, and then diffuse laterally to the multiple quantum well active layer to form a carrier distribution region with uniform carrier distribution, providing uniform pumping carriers for the laser, and effectively improving the performance and stability of the laser operation.

In an embodiment, the gain modulation intensity of the grating structure is inversely proportional to the grating duty cycle of the ridge-shaped laser structure, and the refractive index modulation intensity is further associated with the grating order of the grating structure. The ratio of the gain modulation intensity to the refractive index modulation intensity of the ridge-shaped laser structure may be adjusted by setting the grating order of the grating structure and adjusting the grating duty cycle of the grating structure.

In an embodiment, please continue to refer to FIG. 1-FIG. 2, the insulating layer 101 may include dielectric materials and/or polymeric materials. The insulating layer 101 may include, but is not limited to, at least one of tetra-nitride trisilicon, silicon dioxide, silicon oxynitride, benzocyclobutene, polyimide, and spin-coated glass. When the grating grooves are filled, a small amount of air, photoresist, or metal may be remained which would not seriously affect the grating function. Therefore, the insulating layer may include voids, residual photoresist, and/or residual metal.

In an embodiment, with continuous reference to FIG. 1 and FIG. 2, the doping type of the lower doped dielectric layer 10 is different from the doping type of the ridge-shaped doped dielectric layer 30. For example, the doping type of the lower doped dielectric layer 10 may be P-type, and the doping type of the ridge-shaped doped dielectric layer 30 is N-type. Alternatively, the doping type of the lower doped dielectric layer 10 may be N-type, and the doping type of the ridge-shaped doped dielectric layer 30 is P-type.

Figure 3:
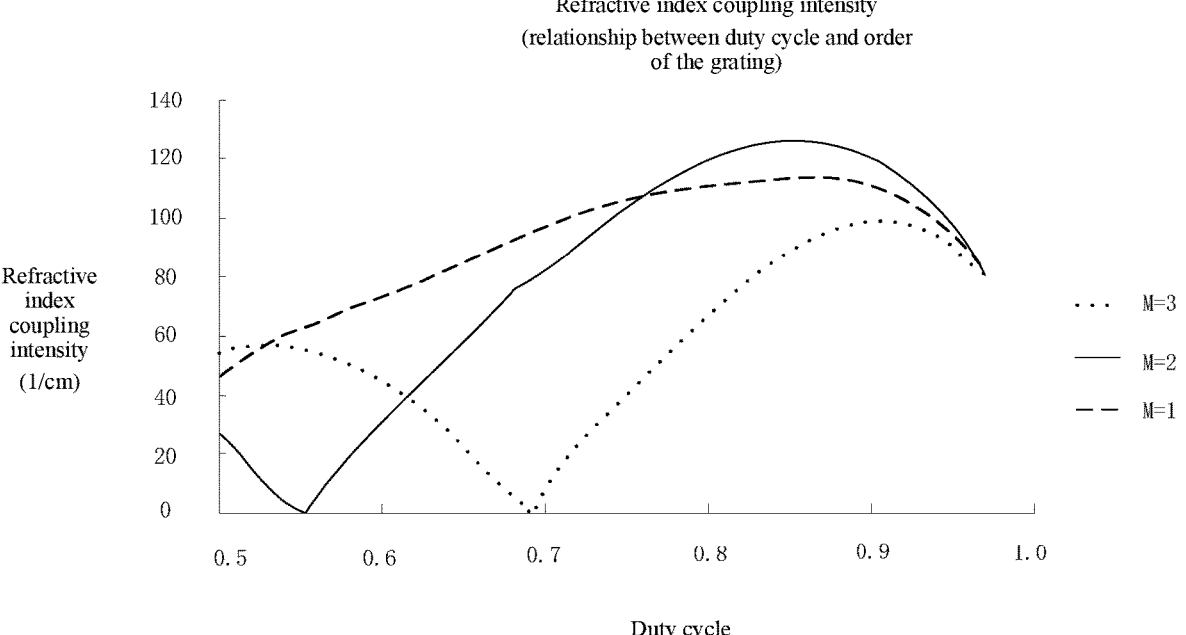
FIG. 3 shows a schematic diagram of a functional relationship between a grating coupling efficiency, and a grating order and a grating duty cycle according to an embodiment of the present application.

In an embodiment, FIG. 3 shows a relationship between the grating duty cycle of the grating structure 40 of the ridge-shaped laser structure and the refractive index modulation intensity at different grating orders. The refractive index modulation intensity of the ridge-shaped laser may be adjusted by setting the grating orders and the grating duty cycles of the grating structure 40 to achieve the desired ratio of the gain modulation intensity to the refractive index modulation intensity of the laser.

Figure 4:
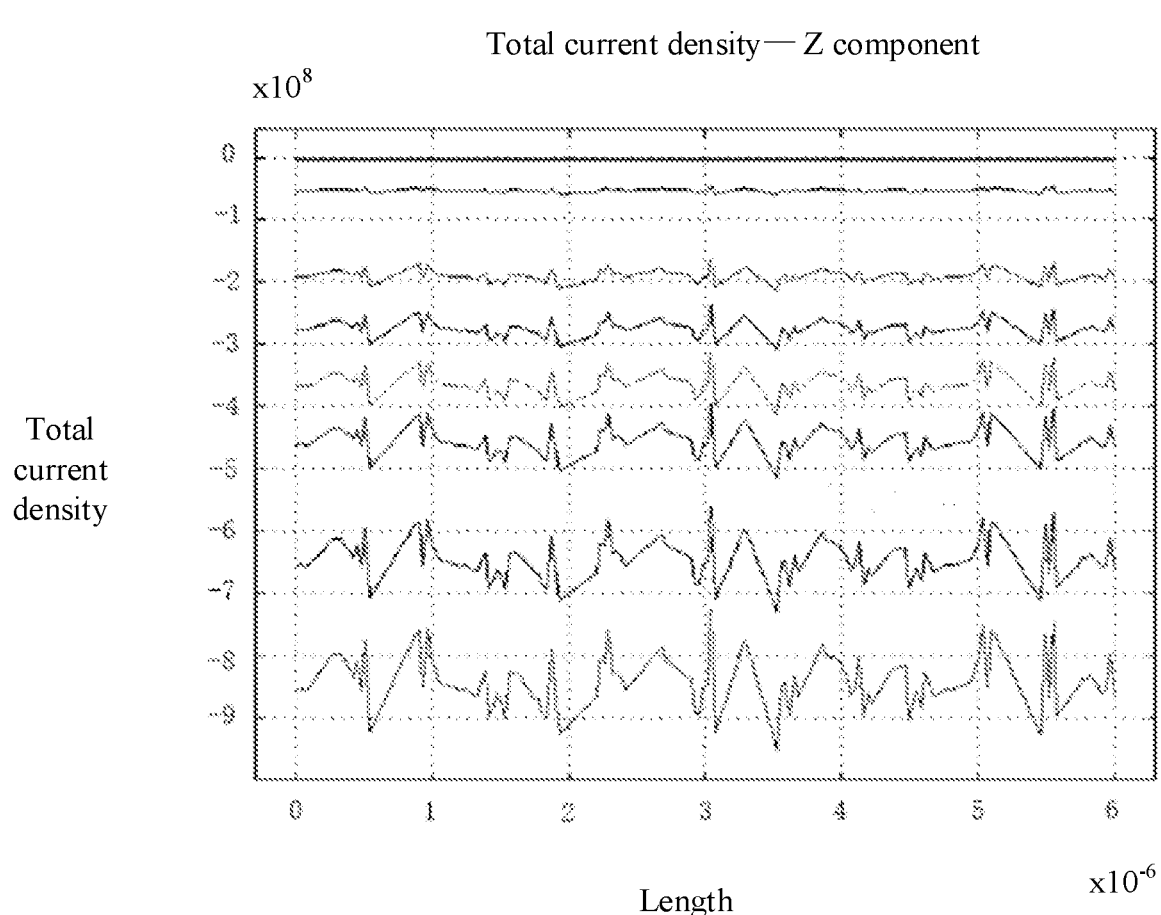
FIG. 4 and FIG. 5 are schematic diagrams of carrier injection patterns according to different embodiments of the present application.
Figure 5:
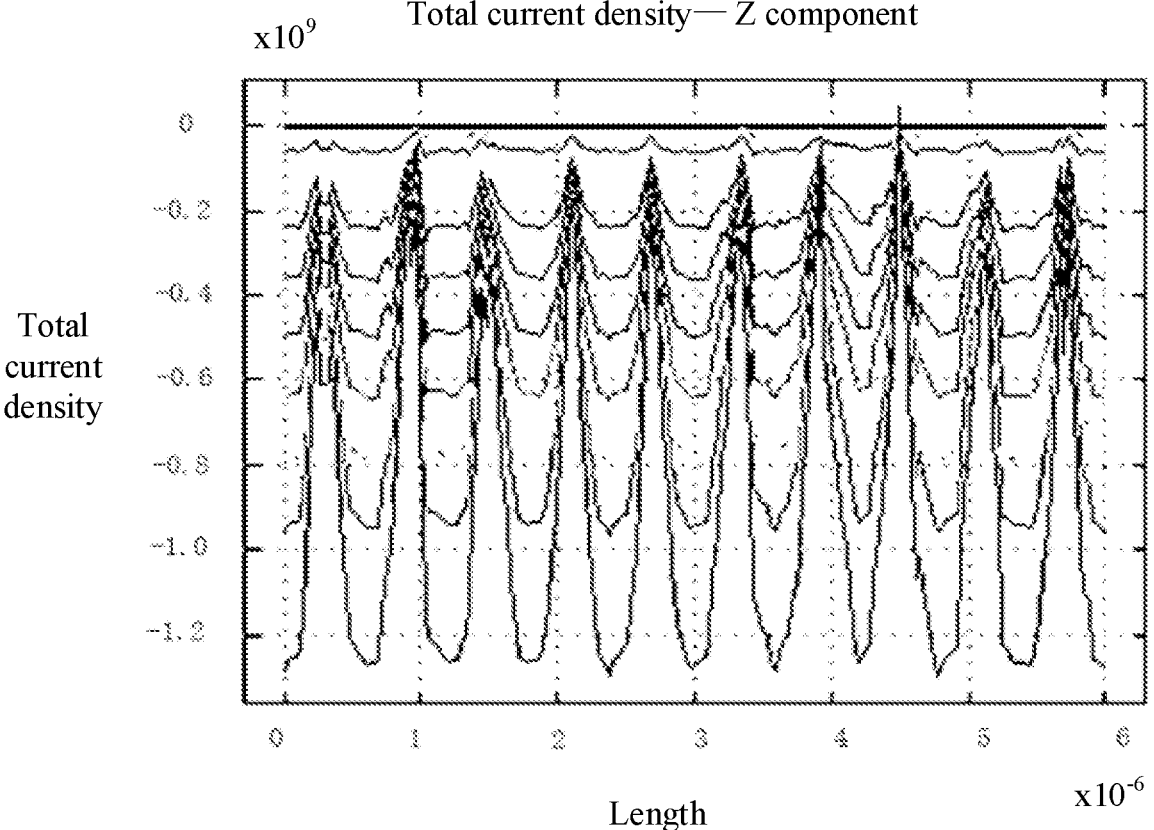

In an embodiment, with continuous reference to FIG. 4 and FIG. 5, in the case that the grating grooves are formed in the ridge-shaped doped dielectric layer, the ratio of the distance d between the bottom of the grating grooves and the upper surface of the multiple quantum well active layer 20 to the width w of the bottom of the grating grooves, i.e., d/w may be set. In an embodiment, the bottom of the grating grooves is close to the upper surface of the multiple quantum well active layer, in other words, the ratio d/w may be any value equal to or less than two, such that the pattern of the carrier distribution formed by the current injected through the top periodic ohmic electrical contact layer is well maintained below the bottom of the grating grooves, which modulates the carrier density distribution in the multiple quantum well active layer, and further modulates the gain of the ridge-shaped laser. As shown in FIG. 5, the carriers are periodically modulated along the grating distribution direction, and the larger the amplitude of the injected current, the larger the modulation of the carrier distribution. In another embodiment, the distance d between the bottom of the grating grooves 41 and the upper surface of the multiple quantum well active layer 20 is larger than the width w of the bottom of the grating groove 41, i.e., d/w is any value greater than one, so that the carriers injected through the top periodic ohmic electrical contact layer diffuse uniformly along the direction of the grating distribution when reaching the bottom of the grating grooves, and forming an uniform carrier distribution in the multiple quantum well active layer 20, as shown in FIG. 4, in this case carrier distribution in the multiple quantum well active layer 20 is uniform at all current injection levels.

In an embodiment, with continuous reference to FIG. 6, the surface etched grating ridge-shaped laser structure with periodic electrode proposed in the present application may also vertically integrate other functional component blocks, such as a functional dielectric layer 70 inserted below the lower doped dielectric layer 10. The connections between the ridge-shaped laser and the other functional components may be realized via an adiabatic taper, but not limited to, the adiabatic taper The light generated by the laser can be directed to a corresponding functional component on the functional dielectric layer through a tapered structure with no (low) loss. The functional components on the functional dielectric layer include, but not limited to, at least one of passive components, active components, control components, and mode conversion components. The passive components include, but not limited to, at least one of spot size converter, multiplexer, or de-multiplexer, etc. The active components include, but not limited to, at least one of electro-absorption modulator or semiconductor amplifier. The control components include, but not limited to, at least one of variable optical attenuator, or optical switch, etc.

In an embodiment, the present application provides a surface etched grating semiconductor laser with a periodic pumping structure including the ridge-shaped laser structure as described in any of the embodiments of the present application. The grating structure including the plurality of grating grooves distributed at periodically spaced along the waveguide direction of the laser and the electrical contact regions defined by the grating grooves is formed on the ridge-shaped doped dielectric layer. The distance between the bottom of the grating grooves and the multiple quantum well active layer is small, and the diffusion of the injected current is limited. Therefore, the carrier density fluctuates periodically with the grating grooves in the direction of the laser cavity, resulting in a certain degree of gain modulation. The phase of the gain coupling coincides with the phase of the refractive index coupling in this application, and the phase of the gain coupling and the phase of the refractive index modulation will not cancel each other, such that the gain modulation intensity and the refractive index modulation intensity can be adjusted by setting the shape, the size and the number of the grating grooves. Therefore, the performance of the laser can be effectively improved, the manufacturing cost is reduced, and the yield and the reliability are improved.

As shown in FIG. 7, the present application provides a method for manufacturing a ridge-shaped laser structure. The method includes the following steps.

At step S110, a substrate and a component epitaxial structure are provided, and the component epitaxial structure includes an optional functional dielectric layer, a lower doped dielectric layer, a multiple quantum well active layer and a ridge-shaped doped dielectric layer stacked in sequence.

At step S120, a grating structure is formed on the ridge-shaped doped dielectric layer, the grating structure includes a plurality of grating grooves periodically spaced along the waveguide direction of the laser, and electrical contact regions defined by the grating grooves. An insulating layer covering at least the sidewalls of the grating grooves is formed in the grating grooves.

At step S130, a top electrode layer is formed, and the top electrode layer forms an ohmic electrical contact region at least with the top surface of the electrical contact regions, so that the carriers injected through the top electrode layer flow through the periodic electrical contact regions and the bottom of the grating grooves in turn, and diffuse laterally to the multiple quantum well active layer to form a carrier distribution region for providing pumping.

It should be note that the above-described embodiments are for illustrative purposes only and are not meant to limit the application. It should be understood that the steps described are not strictly limited to the order in which they are performed, and that the steps may be performed in other orders, unless explicitly stated herein. Moreover, at least a part of the described steps may include multiple sub-steps or multiple stages. These sub-steps or stages are not necessarily executed and completed at the same time, and they may be executed at different times. The order of execution is also not necessarily sequential, they may be performed alternately or in turn with other steps or other sub-steps or at least a portion of a phase of other steps.

The various embodiments in this specification are described in a progressive manner, the focuses of each embodiment are different, and the same and similar parts between the various embodiments may be referred to each other.

The technical features of the above-described embodiments can be combined arbitrarily. In order to simplify the description, not all of the possible combinations of the technical features are described. If there is no contradiction in the combination of these technical features, they should be considered within the scope of the description in this specification.

The above-mentioned embodiments only represent several embodiments of the application, and the descriptions thereof are relatively specific and detailed, but should not be construed as limiting the scope of the patent application. For technical people skilled in the field, without departing from the concept of the present application, several modifications and improvements can be made, which all belong to the protection scope of the application. The scope of protection of the patent application shall be subject to the appended claims.

What is claimed is:

1. A ridge-shaped laser structure, comprising:
a lower doped dielectric layer, a multiple quantum well active layer, a ridge-shaped doped dielectric layer, a grating structure formed on the ridge-shaped doped dielectric layer and a top electrode layer formed on a top surface of the grating structure, stacked in sequence;
wherein the grating structure comprises a plurality of grating grooves periodically spaced along a waveguide direction of the laser and periodically spaced electrical contact regions between the grating grooves, and an insulating layer at least covering sidewalls of each grating groove is formed in each of the grating grooves;
wherein ohmic electrical contact is formed between the top electrode layer and a top surface of each of the electrical contact regions, such that carriers injected through the top electrode layer flow downward through the electrical contact regions and the ridge-shaped doped dielectric layer in turn, and then enter the multiple quantum well active layer, the injected carriers in the multiple quantum well active layer exhibit a certain carrier density distribution region due to an existence of the insulated grating grooves; and
wherein a maximum width of an orthographic projection of a bottom surface of each of the grating grooves on an upper surface of the multiple quantum well active layer is less than or equal to a minimum distance between the bottom surface of the grating grooves and the upper surface of the multiple quantum well active layer, such that the carriers in the certain carrier density distribution region are uniformly distributed under different values of injection current.

2. The ridge-shaped laser structure according to claim 1, wherein a maximum distance between a bottom surface of the grating grooves and an upper surface of the multiple quantum well active layer is less than or equal to two times of a minimum length of an orthographic projection of the bottom surface of the grating grooves on the upper surface of the multiple quantum well active layer, such that a periodical and non-uniform distribution of carriers in the certain carrier density distribution region in the waveguide direction, and forming a gain modulation, wherein a modulation period of the gain modulation is consistent with a grating period.

3. The ridge-shaped laser structure according to claim 2, wherein a refractive index modulation resulted from the grating structure and the gain modulation resulted from the top electrode layer have a preset phase relationship;
an intensity of the gain modulation or an intensity of the refractive index modulation are associated with a grating duty cycle, a grating order of the grating structure, and an average distance between the bottom surface of the grating grooves and the upper surface of the multiple quantum well active layer, wherein the grating duty cycle is defined as a ratio of a width of unetched material between the bottom surface of adjacent grating grooves to the grating period, and the grating period is an average spacing between adjacent grating grooves.

4. The ridge-shaped laser structure according to claim 1, wherein the grating grooves are formed in the ridge-shaped doped dielectric layer, and a depth of the grating grooves is ranged from 0.1h to h, wherein h is a thickness of the ridge-shaped doped dielectric layer.

5. The ridge-shaped laser structure according to claim 1, wherein the top electrode layer partially or completely covers the grating structure.

6. The ridge-shaped laser structure according to claim 1, wherein the insulating layer comprises dielectric materials and/or polymer materials.

7. The ridge-shaped laser structure according to claim 1, wherein the lower doped dielectric layer and the ridge-shaped doped dielectric layer have different doping types.

8. The ridge-shaped laser structure according to claim 1, further comprising at least one functional dielectric layer, wherein the at least one functional dielectric layer is formed on a side of the lower doped dielectric layer away from the multiple quantum well active layer; and wherein the functional dielectric layer is integrated with functional components, and the functional components comprise at least one of passive components, active components, control elements and mode conversion components.

9. A surface etched grating semiconductor laser with a periodic pumping structure, comprising a ridge-shaped laser structure, the ridge-shaped laser structure comprising:

a lower doped dielectric layer, a multiple quantum well active layer, a ridge-shaped doped dielectric layer, a grating structure formed on the ridge-shaped doped dielectric layer and a top electrode layer formed on a top surface of the grating structure, stacked in sequence;

wherein the grating structure comprises a plurality of grating grooves periodically spaced along a waveguide direction of the laser and periodically spaced electrical contact regions between the grating grooves, and an insulating layer at least covering sidewalls of each grating groove is formed in each of the grating grooves;

wherein ohmic electrical contact is formed between the top electrode layer and a top surface of each of the electrical contact regions, such that carriers injected through the top electrode layer flow downward through the electrical contact regions and the ridge-shaped doped dielectric layer in turn, and then enter the multiple quantum well active layer, the injected carriers in the multiple quantum well active layer exhibit certain carrier density distribution region due to an existence of the insulated grating grooves; and wherein a maximum width of an orthographic projection of a bottom surface of each of the grating grooves on an upper surface of the multiple quantum well active layer is less than or equal to a minimum distance between the bottom surface of the grating grooves and the upper surface of the multiple quantum well active layer, such that the carriers in the certain carrier density distribution region are uniformly distributed under different values of injection current.

10. The surface etched grating semiconductor laser with a periodic pumping structure according to claim 9, wherein a maximum distance between a bottom surface of the grating grooves and an upper surface of the multiple quantum well active layer is less than or equal to two times of a minimum length of an orthographic projection of the bottom surface of the grating grooves on the upper surface of the multiple quantum well active layer, such that a periodical and non-uniform distribution of carriers in the certain carrier density distribution region in the waveguide direction, and forming a gain modulation, wherein a modulation period of the gain modulation is consistent with a grating period.

11. The surface etched grating semiconductor laser with a periodic pumping structure according to claim 10, wherein a refractive index modulation resulted from the grating structure and the gain modulation resulted from the top electrode layer have a preset phase relationship;

an intensity of the gain modulation or an intensity of the refractive index modulation are associated with a grating duty cycle, a grating order of the grating structure, and an average distance between the bottom surface of the grating grooves and the upper surface of the multiple quantum well active layer, wherein the grating duty cycle is defined as a ratio of a width of unetched material between the bottom surface of adjacent grating grooves to the grating period, and the grating period is an average spacing between adjacent grating grooves.

12. The surface etched grating semiconductor laser with a periodic pumping structure according to claim 9, wherein the grating grooves are formed in the ridge-shaped doped dielectric layer, and a depth of the grating grooves is ranged from 0.1h to h, wherein h is a thickness of the ridge-shaped doped dielectric layer.

13. The surface etched grating semiconductor laser with a periodic pumping structure according to claim 9, wherein the top electrode layer partially or completely covers the grating structure.

14. The surface etched grating semiconductor laser with a periodic pumping structure according to claim 9, wherein the insulating layer comprises dielectric materials and/or polymer materials.

15. The surface etched grating semiconductor laser with a periodic pumping structure according to claim 9, wherein the lower doped dielectric layer and the ridge-shaped doped dielectric layer have different doping types.

16. The surface etched grating semiconductor laser with a periodic pumping structure according to claim 9, the ridge-shaped laser structure further comprising at least one functional dielectric layer, wherein the at least one functional dielectric layer is formed on a side of the lower doped dielectric layer away from the multiple quantum well active layer;

the functional dielectric layer is integrated with functional components, and the functional components comprise at least one of passive components, active components, control elements and mode conversion components.

* * * * *